United States Patent
Ni et al.

(10) Patent No.: US 6,388,383 B1
(45) Date of Patent: May 14, 2002

(54) METHOD OF AN APPARATUS FOR OBTAINING NEUTRAL DISSOCIATED GAS ATOMS

(75) Inventors: Tuqiang Ni; Wenli Collison, both of Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/539,905

(22) Filed: Mar. 31, 2000

(51) Int. Cl.$^7$ .............................................. H05B 31/26
(52) U.S. Cl. .............. 315/111.81; 156/345; 118/723 IR
(58) Field of Search ........................ 315/111.81, 111.01, 315/111.21; 156/345; 118/723 IR, 723 I

(56) References Cited

U.S. PATENT DOCUMENTS

| | | | |
|---|---|---|---|
| 4,948,458 A | | 8/1990 | Ogle |
| 5,003,225 A | * | 3/1991 | Dandi ................... 315/111.41 |
| 5,554,223 A | * | 9/1996 | Imahashi ................. 118/723 I |
| 5,619,103 A | | 4/1997 | Tobin et al. |
| 5,759,280 A | | 6/1998 | Holland et al. |
| 6,016,131 A | * | 1/2000 | Sato et al. ................... 343/895 |
| 6,027,662 A | * | 2/2000 | Kaveh ......................... 216/59 |
| 6,203,657 B1 | * | 3/2001 | Collison et al. ............ 156/345 |

* cited by examiner

Primary Examiner—Don Wong
Assistant Examiner—Ephrem Alemu
(74) Attorney, Agent, or Firm—Lowe Hauptman Gilman & Berner, LLP

(57) ABSTRACT

A downstream stripper includes a source of dissociated electrically neutral gas atoms derived by a plasma generator responsive to gas molecules including the atoms. The plasma generator includes a chamber responsive to RF electromagnetic fields derived by two coils on opposed sides of the chamber. The coils supply the fields to the interior of the chamber via windows on the opposed sides. The chamber includes metal, electrically grounded walls and an outlet with such walls for attracting charge particles in the plasma. The interiors of the outlet and chamber walls are lined with quartz for capturing the charge particles. The electrically neutral gas atoms have a high concentration and a very low percentage of electrically charged particles flowing with them.

31 Claims, 6 Drawing Sheets

METHOD OF AN APPARATUS FOR OBTAINING NEUTRAL DISSOCIATED GAS ATOMS

FIELD OF THE INVENTION

The present invention relates generally to a method of and apparatus for obtaining electrically neutral gas atoms from ionizable gas molecules including the atoms and, more particularly, to such a method and apparatus wherein the gas molecules are converted into a plasma by plural oscillating electromagnetic fields.

BACKGROUND ART

It is known that electrically neutral gas atoms can be dissociated from ionizable gas molecules including the atoms by supplying the molecules to a plasma generator including a chamber having an electromagnetic field applied to it. The electromagnetic field ionizes the molecules to form a plasma including positively charged ions, electrons, and dissociated electrically neutral atoms.

Such plasma generators are extensively used on a commercial basis to process workpieces, such as semiconductor wafers, glass panels used in flat panel displays, and metal plates. The plasmas are frequently employed to etch materials from the workpieces or are used in chemical vapor deposition (CVD) processes for depositing materials on the workpieces.

In one class of processors, the electromagnetic field is coupled to the gas in the chamber via a dielectric window from a planar or substantially planar plasma excitation coil located outside the chamber. The coil produces an oscillating RF electromagnetic field coupled into the chamber via the window, which is usually in the chamber roof. The oscillating RF field has magnetic and electric field components that propagate through the dielectric window to heat electrons in the gas in a portion of the plasma in the chamber close to the window. The oscillating RF fields induce in the plasma currents that heat electrons in the plasma. The spatial distribution of the magnetic field in the plasma portion close to the window is a function of the sum of individual magnetic field components produced by each turn of the coil. The magnetic and electric field components produced at each point along the coil are respectively functions of the magnitude of RF current and voltage at each point.

The current and voltage differ for different points because of transmission line effects of the coil at the frequency of the RF source. For spiral-like designs, e.g., as disclosed by Ogle, U.S. Pat. No. 4,948,458, and Holland et al., U.S. Pat. No. 5,759,280, the RF currents in the coil are distributed to produce a torroidal shaped magnetic field region in the portion of the plasma close to the window, which is where power is absorbed by the gas to excite the gas to a plasma. The electric field components start at one portion of the coil, propagate through the window in the chamber and return through the window to a second portion of the coil having a potential different from the first portion.

At pressures greater than 10 millitorr, gas phase collisions of electrons, ions, and neutrons in the plasma prevent substantial diffusion of the plasma charged particles outside the torroidal region. As a result, there is a relatively high plasma density (i.e. flux) in a ring like region below the window but low plasma fluxes below the center and peripheral window portions.

Plasma processing of such workpieces is typically performed at vacuum pressures of between 1 millitorr and 100 millitorr, in relatively large vacuum chambers. The vacuum chambers frequently have a diameter of about 30 centimeters. The workpiece is usually mounted on a chuck located on or in proximity to the chamber floor such that there is typically about a 12 centimeter separation between the coil and workpiece. The plasma in such a chamber typically has a concentration of approximately $10^9$ charge particles per cubic centimeter. The ionized particles and the dissociated atoms are evacuated from the processing chamber by a pump connected to an outlet of the chamber. There is no particular effort to provide a source of dissociated atoms in the effluent evacuated from the chamber.

We, and others, invented an apparatus and method which enables a plasma generator somewhat similar to the prior art plasma chambers excited by RF coils to be used as a source of electrically neutral dissociated atoms. The source supplies the atoms to a downstream workpiece processor, in particular a resist etcher for a semiconductor to wafer. Our copending, commonly assigned, U.S. patent application Ser. No. 09/052,906, filed Mar. 31, 1998, now U.S. Pat. No. 6,203,657, entitled "Inductively Coupled Plasma Downstream Strip Module," discloses such an apparatus and method wherein a plasma generator serves as a source of electrically neutral dissociated atoms for a downstream etcher. FIG. 1 is a schematic diagram of such an etcher.

In the arrangement of FIG. 1 gas from a suitable source 8, e.g., oxygen gas ($O_2$) or water vapor ($H_2O$), flows into plasma generator 10 where the gas is converted into an RF plasma including ionized particles, electrons and dissociated neutral atoms (e.g., O resulting from $O_2$ or $H_2O$ being dissociated). The dissociated electrically neutral atoms flow from generator 10 into secondary cylindrical chamber 12, thence into cylindrical processor chamber 13 through openings 14 in quartz baffle plate 16. Gas from a second source 9 flows through tube 15 into chamber 12. Processing chamber 13 includes chuck 18 for holding workpiece 20 in situ. RP source 22, typically having a frequency of 13.56 MHz, supplies an RF bias Voltage to chuck 18. Gas in processing chamber 13 is sucked out of the processing chamber by vacuum pump 23 through annular exhaust 24, at the base of chamber 13. The vacuum pump maintains the pressure in generator 10, as well as chambers 12 and 13, in the range of about 500 millitorr to 5 torr.

Plasma generator 10 includes chamber 26 having interior wall surfaces shaped as a right parallelepiped. Chamber 26 has a root formed of dielectric window 28 which carries spiral, substantially planar coil 30, having interior and exterior excitation terminals, as disclosed, e.g., by Ogle, U.S. Pat. No. 4,948,458. The excitation terminals of coil 30 are connected via matching network 31 to be powered by RF plasma excitation source 32, typically having a frequency of 13.56 MHz and an output power of 2 kilowatt. Matching network 31 typically has a T configuration, including a fixed series capacitor, as well as variable series and shunt capacitors having values controlled by a controller (not shown).

The walls and base 34 of chamber 26 are metal, electrically grounded and arranged to include a dielectric, e.g., quartz, liner 36 on the inner surfaces of the chamber. All interior surfaces of chambers 12, 13 and 14, as well as metal grounded conduit 38 connecting chambers 12 and 26, are lined with the same solid dielectric that lines chamber 26. The dielectric liners in chambers 12, 13, 26 and conduit 38 are made of a material that prevents recombination of the oxygen neutral atoms into $O_2$ oxygen molecules and captures charge particles. The gas incident on workpiece 20 typically has a total density of about $10^{16}$ atoms per cubic centimeter at a pressure of 1 Torr, and charge particle density of less than $10^6$ charges per cubic centimeter, i.e., the charge particle concentration is less than $10^{10}$. In contrast, in commercial prior art processors wherein the plasma generator and the workpiece are in the same chamber, the gas incident on the workpiece typically has a total concentration of about $10^{14}$ atoms per cubic centimeter at a 10 millitorr pressure and a charge particle density of about $10^9$ charges per cubic centimeter, i.e., a charge particle concentration of about $10^5$.

Chamber 26 includes opposed end walls 40 and 42 respectively including aligned ports 44 and 46. Conduit 38 includes a bend just downstream of port 46 to assist in capturing a large number of charge particles which are electrically attracted to the metal conduit wall and are captured by the quartz liner in the conduit. The walls of cylindrical chambers 12 and 13 and the roof of chamber 12 are metal at ground potential with a quartz liner, to assist in capturing charge particles in the plasma that plasma generator 10 produces. The same metal plate forms base 34 of chamber 26 and a part of the roof of chamber 12.

Coil 30 responds to RF source 32 to produce an RF electromagnetic field that is coupled through window 28 into chamber 26. The RF electromagnetic field produces a torroidal shaped plasma density pattern 50 including torroidal region 52 of greatest maximum plasma density that occupies a volume about half-way between the peripheral edges 54 and center line 56 of coil 30. Maximum density torroidal region 52 is relatively small and almost abuts window 28. Consequently, only a small portion of the gas flowing through chamber 26 from port 44 to port 46 is converted into the maximum plasma density in region 52. As a result, the amount of gas flowing through port 44 that is converted to a plasma is relatively low. The energy of the plasma maximum density and the maximum electron density of the plasma are also relatively low because of the close proximity of highest plasma density region 52 to the ambient temperature environment outside window 28.

Modeling shows that the density of plasma in chamber 26 corresponds to the torroidal contours 60–66 of FIG. 2. Each of contours 60–66 defines a constant plasma density region in chamber 26. The plasma density between adjacent contours 60–66 increases so that the plasma density within contour 60 is greater than between any pair of adjacent contours. The plasma density between contours 60 and 61 decreases as the spacing from contour 60 increases, and the plasma density outside contour 66 is less than plasma density inside contour 66. The contours of FIG. 2 resulted from modeling a chamber at a pressure of 1 Torr, responsive to $O_2$ flow of 3,000 standard cubic centimeters per minute (SCCM), with a coil supplied with 2 kilowatt at 13.56 MHz.

Torroidal contour 60 of greatest plasma density is very close to dielectric window 28 and displaced considerably from the horizontal center line 69 of chamber 26. Torroidal contour 62 (the contour which intersects horizontal center line 69 and has the greatest plasma density) has a plasma density of about one-half that of the maximum density in contour 60. The close proximity of contour 60 to window 28 results in a substantial amount of plasma energy being lost to the relatively cool wall of the window. Because of all these factors, plasma generator 10 converts a relatively small volume of gas from source 8 into a plasma. As a result, a relatively small percentage of the atoms in source 8 are converted into dissociated, electrically neutral atoms suitable for processing of workpiece 20.

In many applications it is desirable to obtain dissociated electrically neutral atoms, having a concentration as great as possible. We have not been able to obtain the desired high concentrations from the source of FIG. 1. Merely increasing the power applied to coil 30 does not solve the problem because the increased power is likely to result in arcing as a result of high intensity electric fields that occur by increasing power.

It is, accordingly, an object of the present invention to provide a new and improved method of and apparatus for obtaining dissociated electrically neutral atoms of a desired specie from molecules including the atoms, and to a new and improved downstream workpiece processor responsive to such atoms.

Another object of the invention is to provide a new and improved method of and apparatus for deriving a stream of electrically neutral gaseous atoms of a desired specie from a plasma source including an arrangement for supplying electromagnetic fields to gas molecules including the desired specie, and to a new and improved downstream workpiece processor responsive to such atoms.

A further object of the invention is to provide a new and improved method of and apparatus for deriving electrically neutral gaseous atoms having a high concentration, and to a new and improved downstream processor responsive to such atoms.

An additional object of the invention is to provide a new and improved source of electrically neutral gas atoms derived by dissociating gas molecules including the atoms in a plasma generating chamber responsive to an RF coil excitation arrangement, wherein the gaseous species has a high concentration, but the problems associated with breakdown in applying a large amount of power to the electric coil arrangement are substantially avoided, and to a new and improved downstream processor responsive to such atoms.

SUMMARY OF THE INVENTION

According to one aspect of the invention, an apparatus for processing a workpiece comprises a source of dissociated electrically neutral gas atoms. The source responds to a gas source including molecules including the atoms and includes a plasma generator for converting gas from the gas source into a gaseous plasma including the gas atoms and ionized particles. The plasma generator includes plural sources for deriving oscillating electromagnetic fields that are coupled to gas from the gas source. The sources of the fields are preferably positioned and arranged for applying different oscillating electric fields for exciting the gas to the plasma to different non-overlapping regions of the gas adjacent opposite boundaries of a chamber through which the gas passes. The source of gas atoms is arranged to capture the ionized particles so that substantially none of the ionized particles can flow through an outlet of the source of gas atoms. The outlet and the chamber included in the plasma generator are arranged so that the electrically neutral gas atoms can flow through the outlet. A processing chamber for the workpiece has an inlet connected to be responsive to gas flowing through the outlet.

Another aspect of the invention concerns a source of electrically neutral gas atoms of a desired specie that responds to molecules having the desired specie. The source comprises a chamber having an inlet connected to a source of the gas molecules. The chamber has a metal wall arrangement and an outlet. The chamber has a window arrangement for coupling oscillating electromagnetic fields from the plural field sources to the interior of the chamber. The oscillating electromagnetic field sources and the windows and the inlet and outlet are positioned so the gas flowing from the inlet to the outlet is excited to a plasma including dissociated electrically neutral gas atoms of the desired specie and charge particles. The field sources are preferably positioned so that electric field components derived from them do not overlap. The walls are arranged and adapted to be connected to a source of electric potential and for capturing substantially all of the charge particles in the plasma to enable the dissociated electrically neutral gas atoms to flow through the outlet without a substantial amount of the charge particles in the plasma.

Preferably each of the sources of oscillating electromagnetic fields includes an RF plasma excitation coil. In the preferred embodiment, first and second of the coils are located adjacent opposed boundaries of the chamber. The coils are positioned outside a solid window arrangement transparent to RF electromagnetic plasma excitation fields from the coils. The window arrangement couples electromagnetic plasma excitation fields from the coils to the gas within the chamber.

In one embodiment the window arrangement includes first and second flat windows that extend in first and second parallel planes on opposite sides of the chamber. The first and second coils are substantially flat and extend in third and fourth planes approximately parallel to the first and second parallel planes. The third and fourth planes are respectively outside the first and second planes. In another embodiment, the window arrangement includes first and second windows having curved cross sections, and the first and second coils respectively have curved cross sections with approximately the same shapes as the curved cross sections of the first and second windows.

Preferably, the plural sources of electromagnetic fields are arranged such that the plasma in the chamber has a density that is substantially symmetrical in amplitude and shape with respect to a center line of the chamber that extends in the same direction as the flow of gas from the gas source to the outlet.

Preferably, an RF excitation arrangement supplies substantially the same amount of RF power to each of the coils, each of which has substantially the same configuration and coupling arrangement with the gas in the chamber.

The chamber outlet includes a wall opposite and in close proximity to an opening in the chamber. The chamber and outlet walls include metal portions connected to a source of electric potential for attracting charge particles in the plasma. The wall arrangement and the outlet wall both include a dielectric liner for preventing recombination of the neutral atoms and for capturing the charge particles of the plasma.

Preferably, the spacing between the electromagnetic field sources is in the range of approximately 2.5 to 5.0 centimeters to provide the desired plasma density and non-overlapping electric field components that do not extend to the chamber center line between the windows.

Another aspect of the invention relates to a method of dissociating molecules into electrically neutral atoms of a desired species. The molecules are provided by a source of an ionizable gas including atoms of a desired species. The method comprises applying different plasma exciting oscillating electromagnetic fields to the gas while it is in a chamber. Each of the electromagnetic fields has electric field components that are preferably applied only to non-overlapping portions of the gas adjacent opposed boundaries of the chamber to form the desired electrically neutral gas atoms of the desired species and ionized gas particles. Substantially all the ionized gas particles are captured in the chamber. The electrically neutral atoms of the desired species flow through an outlet of the chamber.

The plural electric fields components are preferably such that plasma and electron density patterns in the chamber are symmetrical in amplitude and shape with respect to a center line of the chamber. The chamber center line extends in generally the same direction as the direction of flow through the outlet. RF current is supplied to different RF plasma excitation coils to derive the different RF plasma exciting electromagnetic fields, in the preferred embodiment.

Pressure in the chamber is preferably in the range of approximately 500 millitorr to 5 Torr to assist in achieving the desired high concentration of electrically neutral atoms.

We are aware that FIG. 17 of Tobin et al., U.S. Pat. No. 5,619,103, includes an illustration of a plasma processing chamber having a roof and base with dielectric windows, outside of which are respectively located first and second RF plasma excitation coils. The coils supply electromagnetic fields to the interior of the processing chamber to produce plasma for processing top and bottom surfaces of workpieces in the chamber.

There is no indication in the Tobin et al. patent that effluent from the processing chamber does not include a substantial amount of ionized particles. The inference from the patent is that the effluent from the chamber includes a substantial amount of ionized particles as well as electrically neutral atoms since there is no attempt to capture the ionized particles and the effluent merely flows to a vacuum pump. For example, the interior walls of the processing chamber are bare metal and not lined. Since the device disclosed in the Tobin et al. patent appears to be a fairly typical plasma processor wherein the workpiece is in the same chamber as the electromagnetic fields which excite the gas to the plasma, the inference is that the pressure within the chamber is in the conventional range of 1–100 millitorr.

In order for the chamber of the Tobin et al. patent to process workpieces on opposite sides with electromagnetic fields from coils adjacent the processing chamber base and roof, the Tobin et al. processing chamber presumably has the typical height of about 12 centimeters. The distance separating opposite side wall portions of the Tobin et al. chamber is typically at least 25 centimeters. The large volume vacuum chamber of the Tobin et al. patent is not suitable for deriving dissociated electrically neutral gas atoms having a high concentration. The device Tobin et al. discloses in FIG. 17 also appears to be impractical for two-sided workpiece processing since the patent discloses no structure for holding a workpiece in a suspended state between the processing chamber base and roof.

The above and still further objects, features and advantages of the present invention will become apparent upon consideration of the following detailed descriptions of several specific embodiments thereof, especially when taken in conjunction with the accompanying drawings.

BRIEF DESCRIPTION OF DRAWINGS

As described.

DETAILED DESCRIPTION OF THE DRAWING

Figure 1:
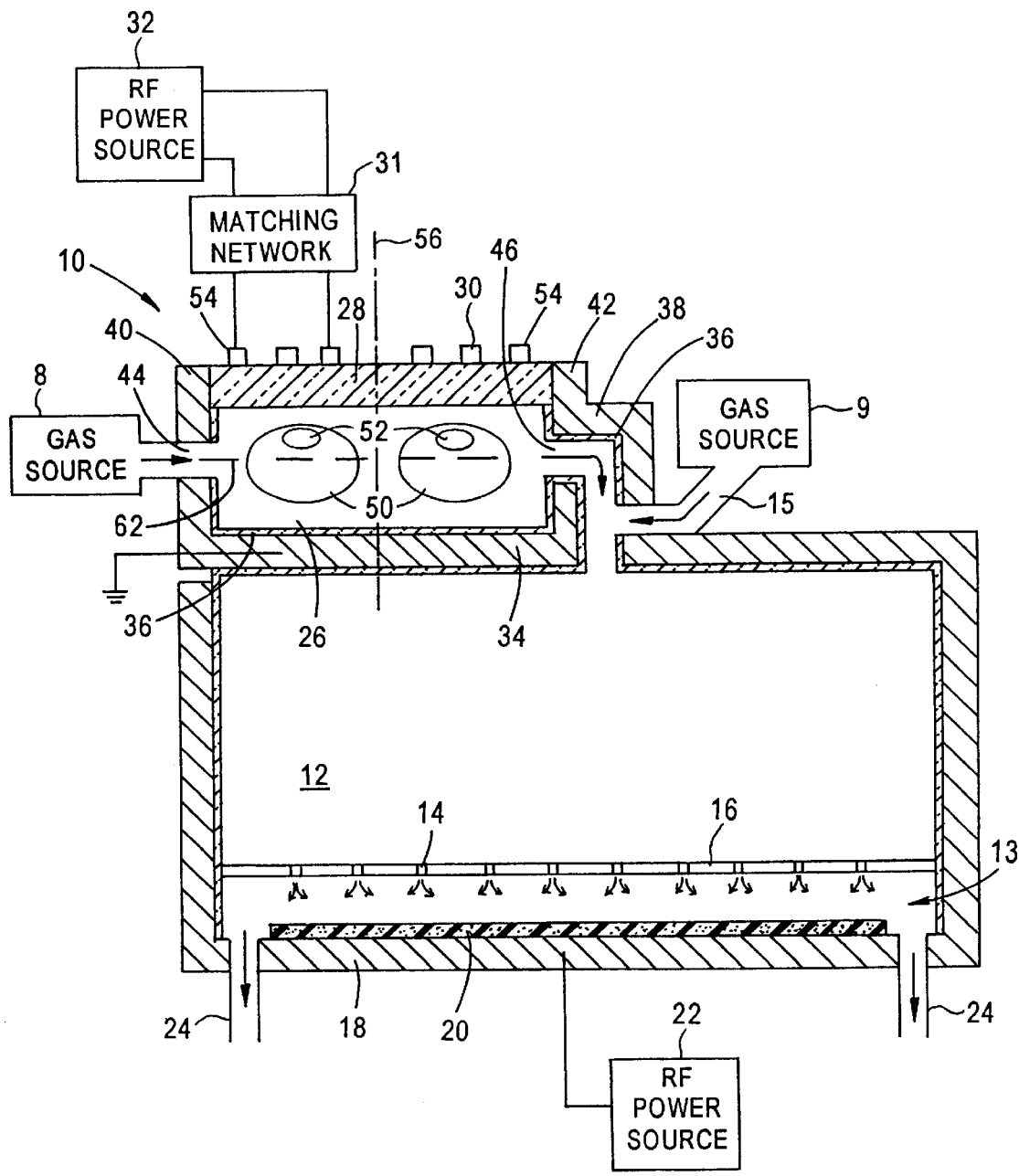
FIGS. 1 and 2 are respectively schematic diagrams of a prior art downstream processor and plasma density patterns in a chamber of the type included in that processor.
Figure 9:
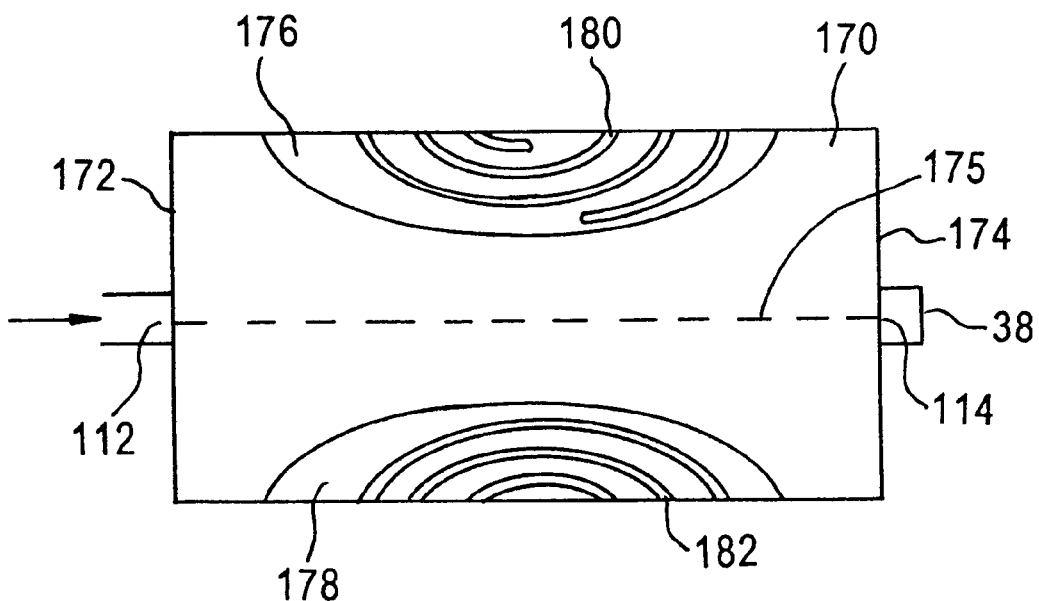
FIG. 9 is a top view of a modification of the chamber illustrated in FIGS. 3–6, wherein the chamber is configured as a cylinder.
Figure 10:
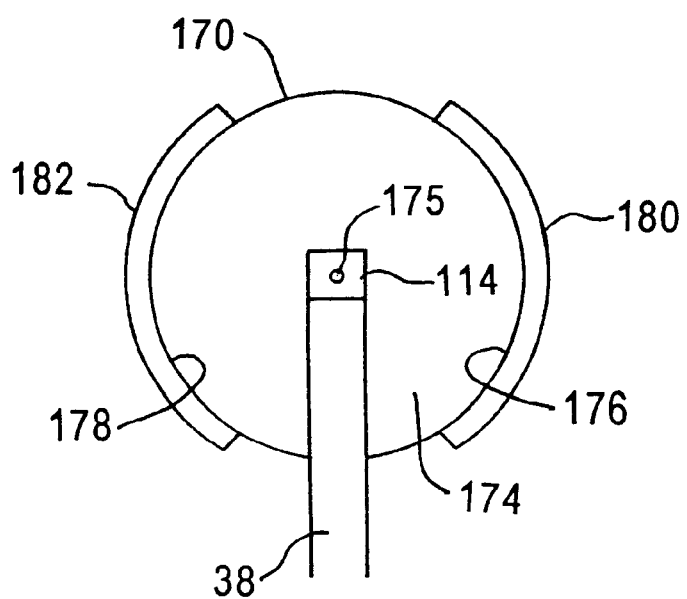
FIG. 10 is an end view of the structure illustrated in FIG. 9.

The remaining figures and the description thereof are concerned primarily with a replacement for plasma generator 10 and the components associated with it, such as chamber 26 and coil 30, as illustrated in FIG. 1. The structures illustrated in FIGS. 3–6, as well as FIGS. 9 and 10, are used in a downstream processor, to replace the plasma generator illustrated in FIG. 1.

In one embodiment, illustrated in FIGS. 3–6, the plasma generator and source of dissociated electrically neutral gas atoms is configured as a right parallelepiped having a square cross section having interior walls forming chamber 101. In particular, chamber 101 is formed by opposed metal end walls 100 and 102, side walls 104 and 106, metal base 108 and metal roof 110. End walls 100 and 102 respectively include inlet port 114 and outlet port 116, both aligned with horizontally extending center line 115 of chamber 101. Inlet 114 is connected to gas source 8, while outlet port 114 is connected to chamber 12 via conduit 38. Side walls 104 and 106 include circular, dielectric windows 118 and 120, respectively; windows 118 and 120 are preferably formed of quartz. The remainder of side walls 104 and 106 is metal.

Figure 5:
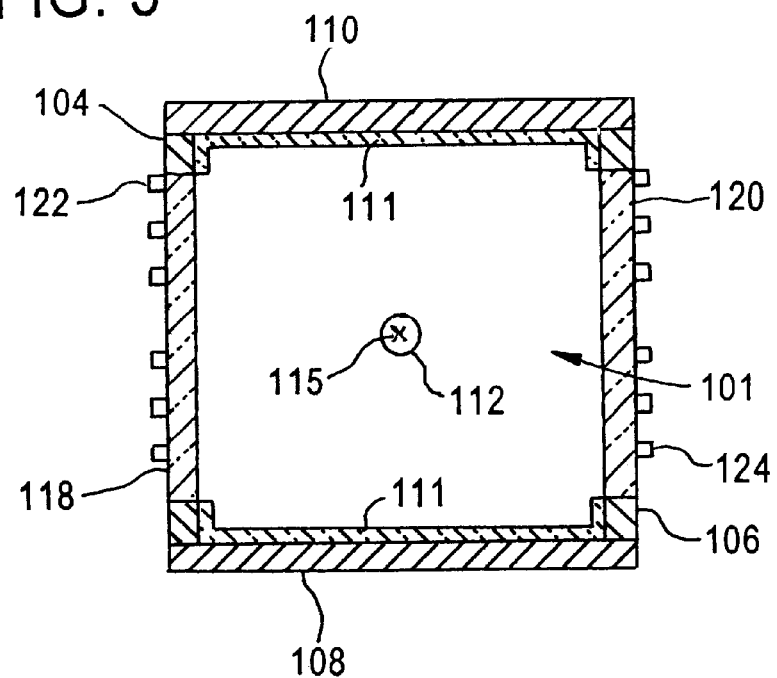
FIG. 5 is a sectional view, taken through the lines 5—5 of FIG. 3.
Figure 6:
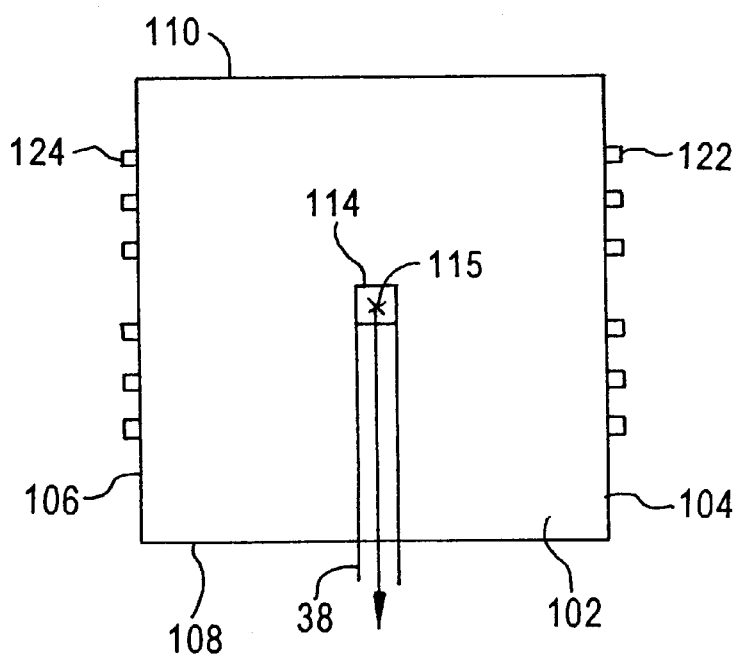
FIG. 6 is a view of one end of the structure illustrated in FIGS. 3 and 4; the view in FIG. 6 is of an end opposite to the end seen in FIG. 5.

All the metal surfaces of the chamber illustrated in FIGS. 3–6 are electrically grounded and the interior walls of these metal surfaces are lined with a dielectric liner which prevents recombination of neutral O atoms into $O_2$ molecules and absorbs charge particles resulting from a plasma being formed inside the chamber of FIGS. 3–6; such a liner is preferably made of quartz, as in the prior art chamber 26 of FIG. 1. In FIG. 5, quartz liners 111 are on the interior surfaces of (1) metal roof 110, (2) metal base 108 and (3) the metal portions of walls 104 and 106 not occupied by windows 118 and 120. Conduit 38 is configured as a baffle, i.e., the same as in FIG. 1, so that it also traps charge particles. Accordingly, considerably more than 99% of the charge particles formed in the chamber of FIGS. 3–6 are captured prior to flowing into secondary chamber 12.

Dielectric windows 118 and 120 respectively carry planar coils 122 and 124, each preferably configured as an Archimedes spiral, as disclosed in the previously mentioned Ogle patent. Each of coils 122 and 124 includes a peripheral excitation terminal 126, an internal excitation terminal 128, and multiple spiral turns between these terminals. Coils 122 and 124 are, in the embodiment illustrated in FIG. 4, driven in parallel by current flowing from matching circuit 130, in turn responsive to RF power that source 132 derives. Preferably, matching network 130 includes a fixed series capacitor and variable series and shunt capacitors having values controlled in a known manner by a controller (not shown), to provide an impedance match for the impedance seen looking into the output terminals of RF source 132 and the impedance the RF source drives. Interior terminals 128 of coils 122 and 124 are respectively connected by capacitors 134 and 136 to ground; the values of capacitors 134 and 136 are preferably selected in accordance with the techniques disclosed in Holland et al., U.S. Pat. No. 5,759,280.

While coils 122 and 124 are illustrated as being driven in parallel by current flowing through matching network 130, it is to be understood that the coils can be connected in series so that, for example, terminal 126 of coil 122 is connected to the matching network output terminal; terminal 128 of coil 122 is connected to terminal 126 of coil 124; and terminal 128 of coil 124 is connected to ground via a suitable capacitor. Alternatively, coils 122 and 124 can be driven from a single source that drives a power divider, having a pair of output ports which drive separate matching networks. A further alternative is to provide two separate sources, having the same or differing frequencies and phases, wherein each of the sources drives a separate one of coils 122 and 124 through separate matching networks.

Typically, approximately 1 kilowatt or 2 kilowatt is supplied to coils 122 and 124. Hence, coils which are identical to the prior art can be employed without a substantial fear of breakdown and it is possible to couple twice as much power into the chamber through windows 118 and 120 than can be coupled with the structure of FIG. 1. In the preferred embodiment, the coupling coefficients of windows 118 and 120 are identical and symmetrical oscillating RF electromagnetic fields having the same intensity and shape are coupled by coils 122 and 124 through the windows. The electric fields resulting from excitation of coils 122 and 124 remain in relatively close proximity to windows 118 and 120 and do not overlap in chamber 101. In other words, the electric field resulting from excitation of coil 122 stays relatively far from the chamber horizontal center line 115, with which ports 112 and 114 are aligned; similarly, the electric field resulting from excitation of coil 124 also stays relatively far from center line 115. Control of the intensity of the electric field components that coils 122 and 124 supply to chamber 101 is provided by controlling the output power of the RF source or sources driving coils 122 and 124.

The electric fields that coils 122 and 124 supply to the interior of the chamber are such that the plasma density has its greater intensity in the center portion of the chamber. Because the electric fields resulting from excitation of sources 122 and 124 are symmetrical, the plasma density and the electron density have the greatest intensity on center line 115. In addition, the volumes of the most intense regions of plasma density and electron density are greatest if the electric fields that coils 122 and 124 derive are symmetrical in intensity and shape.

Figure 2:
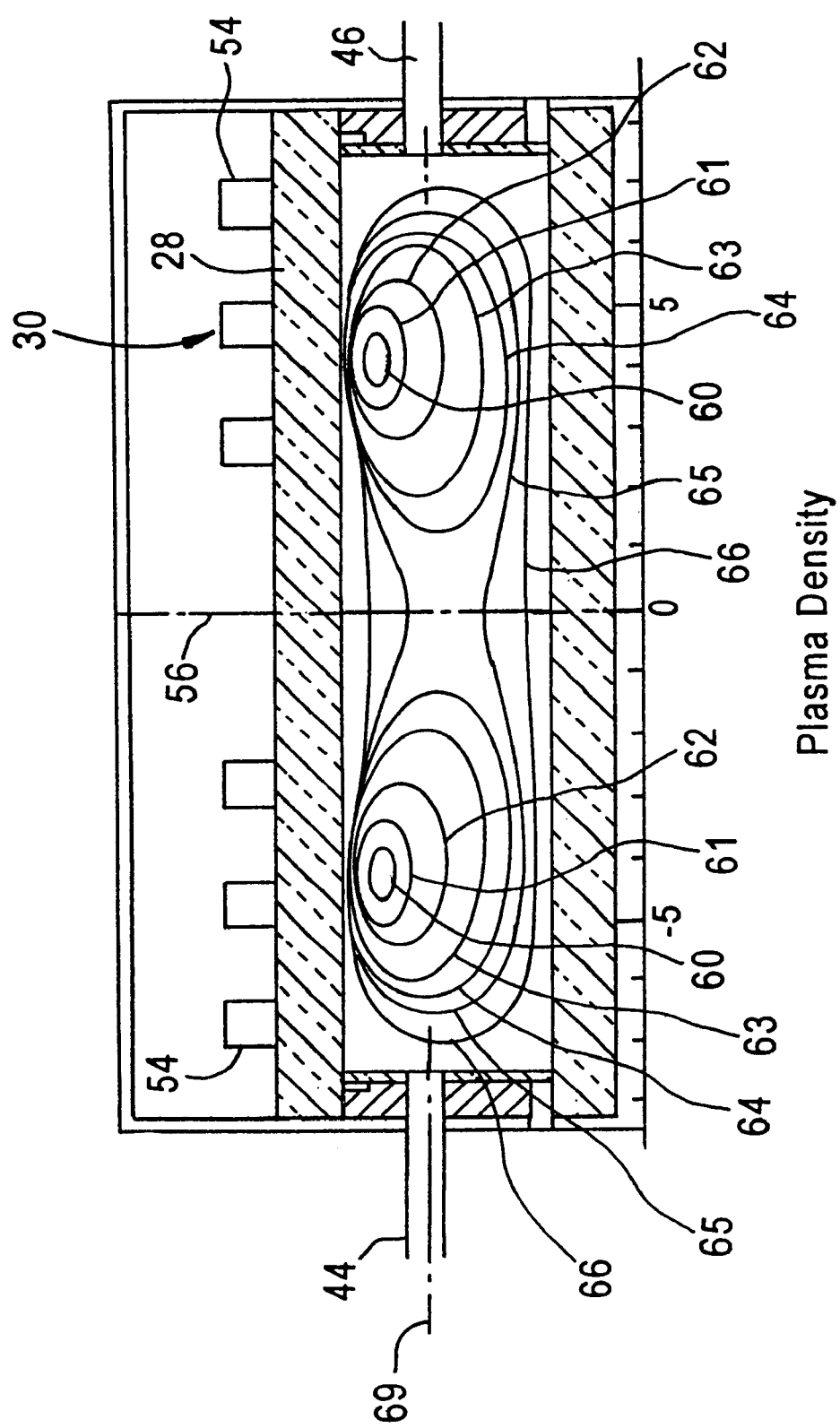
Figure 3:
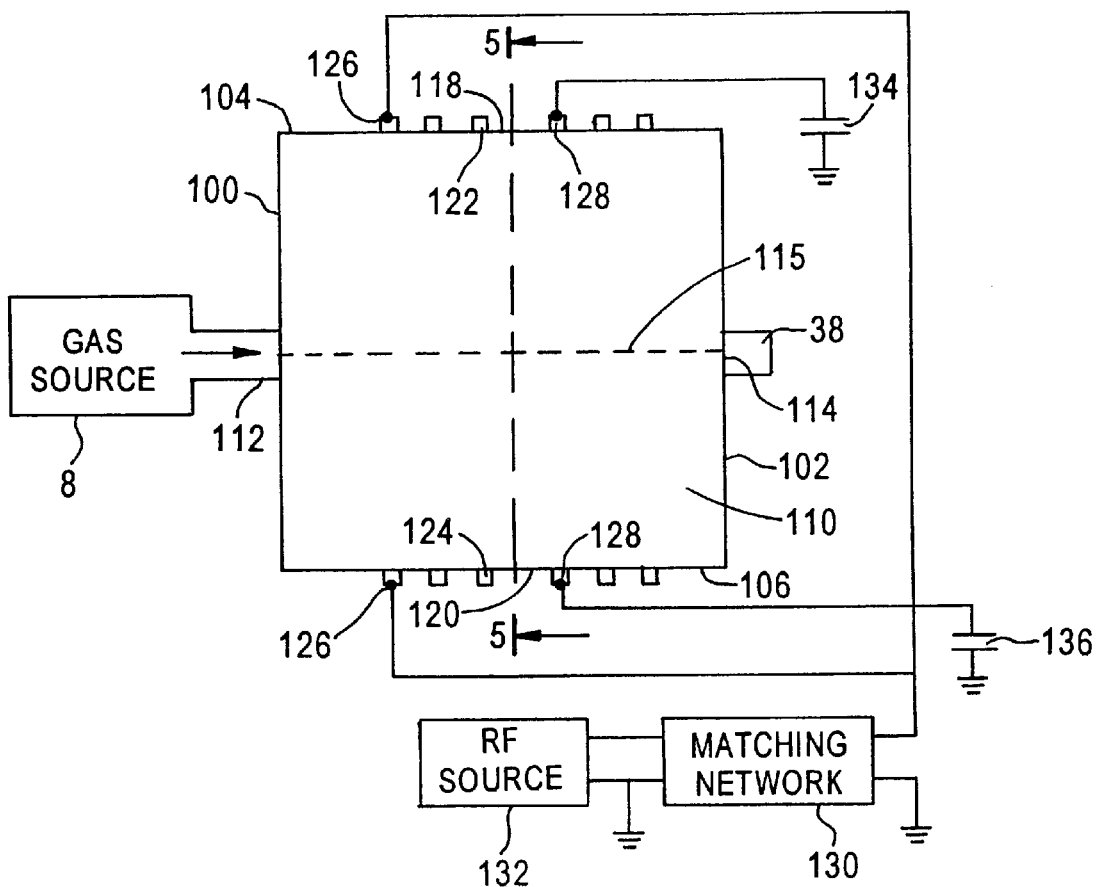
FIG. 3 is a top view of a chamber for deriving dissociated neutral gas atoms in accordance with a preferred embodiment of the present invention, which chamber can be used in lieu of the chamber of FIG. 1.
Figure 4:
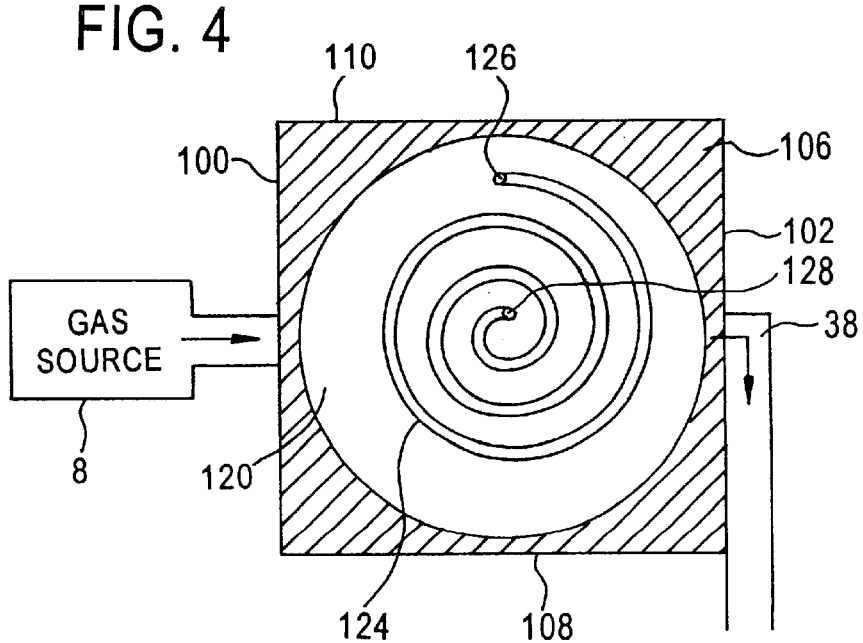
FIG. 4 is a side view of the structure illustrated in FIG. 3.
Figure 7:
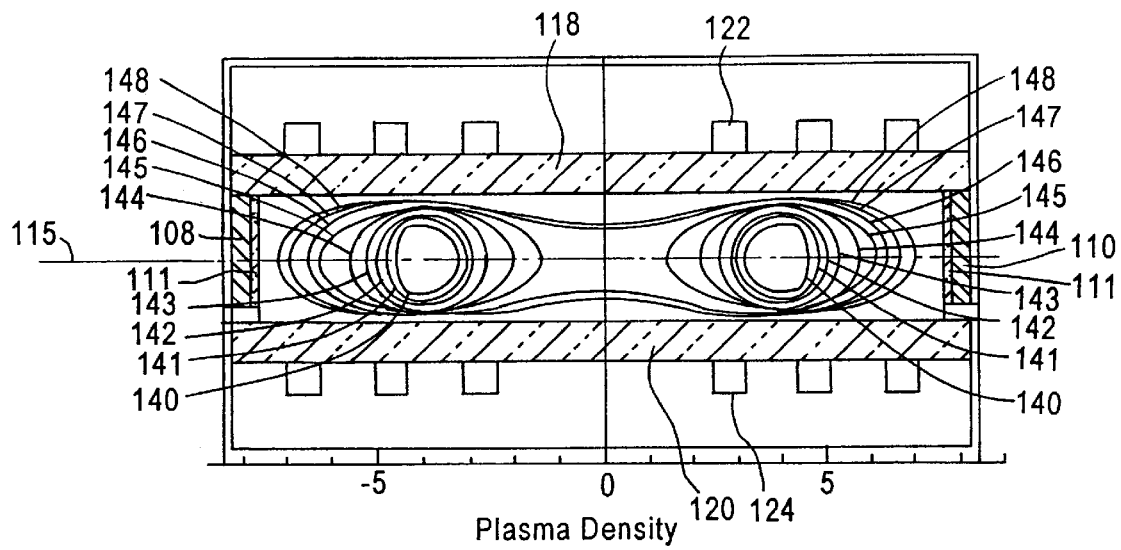
FIGS. 7 and 8 are respectively plasma density and electron density plots in the chamber of FIGS. 3–6.
Figure 8:
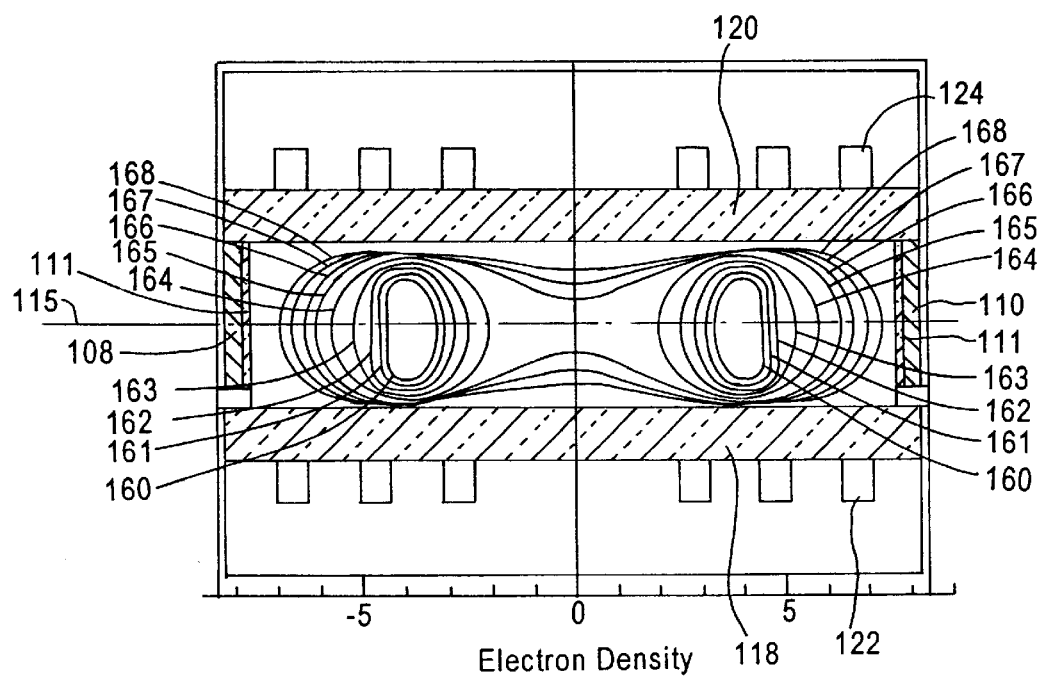

FIGS. 7 and 8 are respectively plots of plasma density and electron density for a modeled situation wherein oxygen gas is supplied to the chamber of FIGS. 3–6 including coils 122 and 124, each powered by 1 kilowatt of RF power. The modeled situation of FIGS. 7 and 8 is identical to the modeled situation of FIG. 2, except that in FIG. 2 a single coil having 2,000 watts applied to it is considered; in FIGS. 7 and 8 two coils, each having 1,000 watts applied is considered. Thus, the modeled situations of FIGS. 2, 7 and 8 are otherwise identical in that the gas species and flow rates are the same, the coil configurations are the same, the window thicknesses are the same, the pressures within the chambers are the same, and the chamber geometries, i.e., shape and size, are the same. In each instance, the spacing between the side walls of the chamber is 2.5 centimeters, the spacing between the roof and base is 2.5 centimeters, the pressure in the chamber is 1 Torr and the coupling coefficient from each coil to the interior of the chamber is the same, as a result of each dielectric window having a thickness of 0.5 centimeters and the same circular shape and diameter. Also, in each situation, the coil diameter, coil cross section, number of winding turns and winding pitch are identical.

As illustrated in FIG. 7, the two coil excitation of the chamber illustrated in FIGS. 3–6 produces torroidal plasma density contours 140–148. The volume of maximum plasma density contour 140 is considerably larger than the volume of maximum density contour 60, FIG. 2. In addition, the center of contour 140 is on axis 115. The plasma densities in maximum density contours 60 and 140 are about the same. Because maximum density contour 140 is in the center of the chamber of FIGS. 3–6 and remote from windows 122 and 124, considerably lower amounts of power are lost to the walls of the chamber than for the situation of FIG. 2. The considerably larger volume of maximum density contour 140 compared to contour 60 and the alignment of contour 140 with center line 115 result in a greater number of gas molecules from source 8 being converted into a plasma and dissociated into electrically neutral atoms.

FIG. 8 includes torroidal electron density contours 160–168. Maximum electron density torroidal contour 160 is aligned with center line 115 and extends into close proximity with coils 122 and 124. Modeling indicates that for the 2,000 watt excitation situation of FIG. 2, the average electron temperature is 1.85 electron volts (eV), the average electron density per cubic centimeter is $2.0 \times 10^{11}$ and oxygen dissociation is 28.9%. In contrast, when the chamber of FIGS. 3–6 is energized so that each of coils 122 and 124 is supplied with 1,000 watts, the average electron temperature is 2.00 eV, the average electron density is $3.2 \times 10^{11}$ electrons per cubic centimeter, and the oxygen dissociation is 39.8%. If each of coils 122 and 124 of the chamber of FIGS. 3–6 is supplied with 2,000 watts, the average electron temperature is 1.93 eV, the average electron density is $7.8 \times 10^{11}$ and the oxygen dissociation increases to 47.6%.

Hence, by supplying the same amount of total power to the chamber of FIGS. 3–6 as is supplied to the chamber of FIG. 1, the average electron density increases by about 60%, and oxygen dissociation percentage increases by approximately 33%. If the same power is supplied to each of coils 122 and 124 as is supplied to coil 30, i.e., there is a doubling of total power, average electron density increases by almost a factor of four and oxygen dissociation increases by approximately 60%. It is possible to double the power supply to the chamber of FIGS. 3–6 without causing a voltage breakdown because voltage breakdown is primarily a function of power supplied to each individual coil. It is not possible, however, to double the power supplied to coil 30 of chamber 26, FIG. 1, without encountering breakdown unless there is a substantial redesign of the coil.

In a further embodiment of the invention, illustrated in FIGS. 9 and 10, chamber 26, FIG. 1, is replaced with a cylindrical chamber including tubular metal wall 170 and metal end walls 172 and 174, respectively including ports 112 and 114. Opposite sides of tubular wall 170 include circular, dielectric windows 176 and 178, preferably made of quartz. Quartz also lines the interior of tubular wall 170, as well as the interiors of end walls 172 and 174. Windows 176 and 178 respectively carry spiral RF plasma excitation coils 180 and 182 that are electrically connected to each other in one of the manners previously discussed. The surfaces of windows 176 and 178 and spiral coils 180 and 182 conform with the circular cross sections of tubular wall 170.

Coils 180 and 182, when energized by an RF plasma energizing source, produce inside of the chamber formed by walls 170, 172 and 174, RF electromagnetic fields having non-overlapping electric field components that extend into the interior of the chambers by only a small amount so that the electric field components resulting from excitation of coils 180 and 182 do not overlap. The resulting plasma density and electron density are similar to those respectively illustrated in FIGS. 7 and 8.

While there have been described and illustrated plural embodiments of the invention, it will be clear that variations in the details of the embodiments specifically illustrated and described may be made without departing from the true spirit and scope of the invention as defined in the appended claims. In particular, more than two sources of oscillating electromagnetic fields can be employed; for example, the structure of FIGS. 3–6 or FIGS. 9 and 10 can be modified so four coils at mutually right angles can be employed.

We claim:

1. Apparatus for processing a workpiece, comprising a source of dissociated electrically neutral gas atoms, the source being adapted to be responsive to a gas source including molecules including the atoms, the source of neutral gas atoms including a plasma generator for converting gas from the gas source into a gaseous plasma including the gas atoms and ionized particles, the plasma generator including plural sources for deriving oscillating electromagnetic fields adapted to be coupled to gas from the gas source, the source of neutral gas atoms being arranged to capture the ionized particles so that substantially none of the ionized particles can flow through an outlet of the source of neutral gas atoms, the outlet and the chamber included in the plasma generator being arranged so that the electrically neutral gas atoms can flow through the outlet, and a processing chamber for the workpiece having an inlet connected to be responsive to gas flowing through the outlet.

2. The apparatus of claim 1 wherein the sources of the fields are positioned and arranged for applying different oscillating electric field components for exciting the gas to the plasma to different non-overlapping regions of the gas, the different regions being adjacent opposite boundaries of a chamber through which the gas is adapted to pass.

3. The apparatus of claim 1 wherein each of the sources of oscillating electromagnetic fields includes an RF plasma excitation coil, first and second of the coils being located adjacent opposed boundaries of the chamber.

4. The apparatus of claim 3 wherein the coils are positioned and adapted to be excited for applying different oscillating electric field components for exciting the gas to the plasma to different non-overlapping regions of the gas, the different regions being adjacent the opposed boundaries of the chamber.

5. The apparatus of claim 3 wherein the plasma generator includes a wall arrangement for enabling the gas to pass from the alas source to the outlet, the wall arrangement being part of the chamber included in the plasma generator, the coils being positioned outside the wall arrangement, the wall arrangement including a solid window arrangement transparent to RF electromagnetic plasma excitation fields from the coils for coupling the REF electromagnetic plasma excitation fields from the coils to the gas within the wall arrangement.

6. The apparatus of claim 5 wherein the coils are positioned and adapted to be excited for applying different oscillating electric field components for exciting the gas to the plasma to different non-overlapping regions of the gas, the different regions being adjacent the opposed boundaries of the chamber.

7. The apparatus of claim 5 wherein the window arrangement includes first and second flat windows that extend in first and second parallel planes on opposite sides of the chamber included in the plasma generator.

8. The apparatus of claim 7 wherein the first and second coils are substantially flat and extend in third and fourth planes approximately parallel to the first and second parallel planes, the third plane being outside the first plane, the fourth plane being outside the second plane.

9. The apparatus of claim 5 wherein the window arrangement includes first and second windows having curved cross sections, the first and second coils respectively having curved cross sections with approximately the same shapes as the curved cross sections of the first and second windows.

10. The apparatus of claim 1 wherein the plural sources of electromagnetic fields are arranged such that the plasma in the chamber of the plasma generator has a density that is substantially symmetrical in amplitude and shape with respect to a center line of the plasma generator chamber that extends in the same general direction as the flow of gas from the gas source to the outlet.

11. The apparatus of claim 10 wherein the sources of the fields are positioned and arranged for applying different oscillating electric field components for exciting the gas to the plasma to different non-overlapping regions of the gas, the different regions being adjacent opposite boundaries of a chamber through which the gas is adapted to pass.

12. The apparatus of claim 10 wherein each of the sources of oscillating electromagnetic fields includes an RF plasma excitation coil, first and second of the coils being located adjacent opposed boundaries of the chamber.

13. The apparatus of claim 12 further including an RF excitation arrangement for supplying substantially the same amount of RF power to each of the coils, wherein each of the coils has substantially the same configuration and coupling arrangement with the gas in the chamber.

14. The apparatus of claim 1 wherein the plasma generator chamber and a chamber connected to be responsive to gas flowing through the outlet are separated by a common member, the coils being in planes displaced from the common member.

15. A method of dissociating molecules of an ionizable gas including atoms of a desired species into electrically neutral atoms of the desired species, the method comprising applying different plasma exciting oscillating electromagnetic fields to the gas while it is in a chamber, each of the electromagnetic fields having electric field components, the electric field components being applied to the gas to form the electrically neutral gas atoms of the desired species and ionized gas particles, capturing substantially all of the ionized gas particles in the chamber, and flowing the electrically neutral atoms of the desired species through an outlet of the chamber.

16. The method of claim 15 wherein the electric field components are applied only to non-overlapping portions of the gas adjacent opposed boundaries of the chamber.

17. The method of claim 15 wherein the plural electric fields components are such that electron density patterns in the chamber are symmetrical in amplitude and shape with respect to a center line of the chamber, the chamber center line extending in generally the same direction as the direction of flow through the outlet.

18. The method of claim 17 further including supplying RF current to different RF plasma excitation coils to derive the different RF plasma exciting electromagnetic fields.

19. The method of claim 17 wherein the electric field components are applied only to non-overlapping portions of the gas adjacent opposed boundaries of the chamber.

20. The method of claim 15 further including supplying RF current to different RF plasma excitation coils to derive the different RF plasma exciting electromagnetic fields.

21. The method of claim 15 wherein pressure in the chamber is in the range of approximately 500 millitorr to 5 Torr.

22. A source of electrically neutral gas atoms of a desired specie adapted to be responsive to a gas source including molecules having the desired specie, the source of neutral gas atoms comprising a chamber having an inlet for connection to the source, the chamber having a metal wall arrangement and an outlet, plural oscillating electromagnetic field sources, the field sources being respectively adjacent sides of the chamber, the chamber including a window arrangement for coupling oscillating electromagnetic fields from the field sources to the interior of the chamber, the oscillating electromagnetic field sources and the windows and the inlet and outlet being positioned so the gas from the gas source flowing from the inlet to the outlet is excited to a plasma including dissociated electrically neutral gas atoms of the desired specie and charge particles, the wall arrangement being arranged and adapted to be connected to a source of electric potential and for capturing substantially all of the charge particles in the plasma to enable the dissociated electrically neutral gas atoms to flow through the outlet without a substantial amount of the charge particles in the plasma.

23. The source of claim 22 wherein the electromagnetic field sources are positioned so that electric field components derived from the electromagnetic field sources do not overlap.

24. The source claim 22 further including a workpiece processing chamber having an inlet connected in fluid flow relation with the chamber outlet so as to be responsive to the dissociated electrically neutral atoms flowing through the outlet.

25. The source of claim 24 wherein the chamber outlet includes a wall with a metal portion adapted to be connected to the source of electric potential, the outlet wall being arranged for capturing charge particles in the plasma.

26. The source of claim 25 wherein each of the wall arrangement of the chamber and the wall of the outlet includes a dielectric liner for preventing recombination of the neutral atoms into molecules and for capturing the charge particles of the plasma.

27. The source of claim 24 wherein the outlet includes an opening in the chamber and a tube having wall with a metal portion adapted to be connected to the source of electric potential, the wall of the tube facing and being in close proximity to the outlet for capturing charge particles in the plasma.

28. The source of claim 22 wherein the outlet includes an opening in the chamber and a tube having a wall facing and being in close proximity to the outlet for capturing charge particles in the plasma.

29. The source of claim 22 wherein the spacing between the field sources is in the range of approximately 2.5 to 5.0 centimeters.

30. The source of claim 22 wherein the wall arrangement includes a dielectric liner for substantially preventing recombination of the neutral atoms and for capturing the charge particles of the plasma.

31. The source of claim 22 wherein each of the field sources includes a separate RF plasma excitation coil.

* * * * *